US008778785B2

(12) United States Patent
Chesterfield et al.

(10) Patent No.: US 8,778,785 B2
(45) Date of Patent: Jul. 15, 2014

(54) PROCESS FOR FORMING AN ELECTROACTIVE LAYER

(75) Inventors: Reid John Chesterfield, Santa Barbara, CA (US); Nugent Truong, Ventura, CA (US); Jeffrey A. Merlo, Wilmington, DE (US); Adam Fennimore, Wilmington, DE (US); Jonathan M. Ziebarth, Santa Barbara, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 306 days.

(21) Appl. No.: 12/937,569

(22) PCT Filed: May 15, 2009

(86) PCT No.: PCT/US2009/044090
§ 371 (c)(1),
(2), (4) Date: Dec. 10, 2010

(87) PCT Pub. No.: WO2009/140570
PCT Pub. Date: Nov. 19, 2009

(65) Prior Publication Data
US 2011/0095308 A1    Apr. 28, 2011

Related U.S. Application Data

(60) Provisional application No. 61/053,551, filed on May 15, 2008.

(51) Int. Cl.
*H01L 21/20*    (2006.01)
*H01L 21/36*    (2006.01)
*H01L 33/00*    (2010.01)
*H01L 51/56*    (2006.01)
*H01L 31/18*    (2006.01)
*H01L 51/52*    (2006.01)
*H01L 51/00*    (2006.01)

(52) U.S. Cl.
CPC ............... *H01L 51/56* (2013.01); *H01L 31/18* (2013.01); *H01L 51/0026* (2013.01); *H01L 51/0004* (2013.01); *H01L 51/5203* (2013.01)
USPC ............................................ 438/502; 438/99

(58) Field of Classification Search
USPC ............................................ 257/79; 438/502
See application file for complete search history.

(56) References Cited

U.S. PATENT DOCUMENTS 3,630,660 A    12/1971    Wedler
4,421,781 A    12/1983    Reznik
(Continued)

FOREIGN PATENT DOCUMENTS

CN    1359253 A    7/2002
CN    1481204 A    3/2004
(Continued)

OTHER PUBLICATIONS

Matsumoto, M. "Fabrication of Solid-State Dye-Sensitized TiO2 Solar Cell Using Polymer Electrolyte" Bulletin of the Chemical Soc. of Japan vol. 74 No. 2 pp. 387-393 copyright 2001 and released on Jul. 1, 2002.*

(Continued)

*Primary Examiner* — Yu-Hsi D Sun
*Assistant Examiner* — Grant Withers

(57) ABSTRACT

There is provided a process for forming a layer of electroactive material having a substantially flat profile. The process includes the steps of providing a workpiece having at least one active area; depositing a liquid composition including the electroactive material onto the workpiece in the active area, to form a wet layer; treating the wet layer on the workpiece at a controlled temperature in the range of −25 to 80° C. and under a vacuum in the range of $10^{-6}$ to 1,000 Torr, for a first period of 1-100 minutes, to form a partially dried layer; and heating the partially dried layer to a temperature above 100° C. for a second period of 1-50 minutes to form a dried layer.

20 Claims, 5 Drawing Sheets

(56) References Cited

U.S. PATENT DOCUMENTS

| | | | |
|---|---|---|---|
| 5,694,701 | A | 12/1997 | Huelsman et al. |
| 6,297,174 | B2* | 10/2001 | Iguchi et al. .................. 438/781 |
| 6,303,238 | B1 | 10/2001 | Thompson et al. |
| 6,630,274 | B1* | 10/2003 | Kiguchi et al. .................. 430/7 |
| 6,670,645 | B2 | 12/2003 | Grushin et al. |
| 6,713,389 | B2* | 3/2004 | Speakman .................. 438/674 |
| 6,924,593 | B2 | 8/2005 | Seki et al. |
| 7,011,984 | B2* | 3/2006 | Gilton .............................. 438/99 |
| 7,023,013 | B2 | 4/2006 | Ricks et al. |
| 7,300,686 | B2* | 11/2007 | Morii et al. ................. 427/421.1 |
| 8,158,517 | B2* | 4/2012 | Yamamoto et al. ........... 438/674 |
| 2002/0079832 | A1 | 6/2002 | Van Tongeren et al. ...... 313/504 |
| 2002/0109456 | A1* | 8/2002 | Morii et al. ..................... 313/504 |
| 2003/0054186 | A1* | 3/2003 | Miyashita et al. ............. 428/500 |
| 2003/0083203 | A1* | 5/2003 | Hashimoto et al. ........... 505/100 |
| 2003/0235935 | A1 | 12/2003 | Yamazaki et al. |
| 2004/0102577 | A1 | 5/2004 | Hsu et al. |
| 2004/0127637 | A1 | 7/2004 | Hsu et al. |
| 2004/0144975 | A1 | 7/2004 | Seki et al. |
| 2005/0003645 | A1* | 1/2005 | Hirai .............................. 438/584 |
| 2005/0026344 | A1 | 2/2005 | Weng et al. |
| 2005/0129843 | A1 | 6/2005 | Wu et al. |
| 2005/0205860 | A1 | 9/2005 | Hsu et al. |
| 2006/0014365 | A1 | 1/2006 | Kugler et al. |
| 2006/0033421 | A1 | 2/2006 | Matsuura et al. |
| 2006/0109456 | A1 | 5/2006 | Chou et al. |
| 2007/0072004 | A1 | 3/2007 | Sakai et al. |
| 2007/0205409 | A1 | 9/2007 | Lecloux et al. |
| 2007/0278936 | A1* | 12/2007 | Herron et al. .................. 313/504 |
| 2008/0020572 | A1 | 1/2008 | Wu et al. |
| 2008/0071049 | A1 | 3/2008 | Radu et al. |
| 2008/0289676 | A1 | 11/2008 | Guidotti et al. |

FOREIGN PATENT DOCUMENTS

| | | |
|---|---|---|
| CN | 1515338 A | 7/2004 |
| EP | 1598880 A2 | 11/2005 |
| JP | 2003163151 A | 6/2003 |
| JP | 2004140004 A | 5/2004 |
| JP | 2004223354 A | 8/2004 |
| JP | 2005-158824 | 6/2005 |
| JP | 2005158824 | 6/2005 |
| JP | 2005172316 A | 6/2005 |
| JP | 2005-235852 | 9/2005 |
| JP | 2005235852 | 9/2005 |
| JP | 2006-193663 | 7/2006 |
| JP | 2006193663 | 7/2006 |
| JP | 2007123257 A | 5/2007 |
| JP | 2007123877 A | 5/2007 |
| KR | 100663076 B1 | 1/2007 |
| KR | 1020070044145 A | 4/2007 |
| WO | 9902933 A1 | 1/1999 |
| WO | WO00/70655 | 11/2000 |
| WO | WO01/41512 A1 | 6/2001 |
| WO | 02069119 A1 | 9/2002 |
| WO | WO03/008424 A1 | 1/2003 |
| WO | WO03/040257 A1 | 5/2003 |
| WO | WO03/063555 A1 | 7/2003 |
| WO | WO03/091688 A2 | 11/2003 |
| WO | WO2004/016710 A1 | 2/2004 |
| WO | WO2005/052027 A1 | 6/2005 |
| WO | 2005123856 A1 | 12/2005 |
| WO | 2006072022 A2 | 7/2006 |
| WO | WO2007/145979 A2 | 12/2007 |

OTHER PUBLICATIONS

Jou, J "High-Efficiency Flourescent White Organic Light-Emitting Diodes Using Double Hole-Transporting-Layers" Proc. of SPIE vol. 6999 published May 2, 2008 pp. 1-8).*

Ouyang, Jianyong "On the mechanism of conductivity enhancement in poly(3,4-ethylenedioxythiophene):poly(styrene sulfonate) film through solvent treatment" Polymer 45 Oct. 22, 2004 pp. 8443-8450.*

Dobbelin, Markus "Influence of Ionic Liquids on the Electrical Conductivity and Morphology of PEDOT:PSS Films" Chem. Mater. 19 Mar. 28, 2007 pp. 2147-2149.*

Kim, J. Y. "Enhancement of electrical conductivity of poly(3,4-ethylenedioxythiophene)/poly(4-styrenesulfonate) by a change of solvents" Synthetic Metals 126 iss. 2-3 Feb. 14, 2002 pp. 311-316.*

BASF product physical properties sheet for N-Methylpyrrolidone available online at http://ww2.basf.us/diols/bcdiolsnmp_properties.html as of Nov. 15, 2013.*

CRC Handbook of Chemistry and Physics, 81$^{st}$ Edition (2000-2001) (Book Not Included).

Kirk-Othmer Encyclopedia of Chemical Technology, Fourth Edition, vol. 18, pp. 837-860, 1996 Y. Wang.

International Search Report, Korean Intellectual Property Office, Daejeon, Republic of Korea, in PCT/US2009/044090, PCT counterpart of the present application, Byoung Rho Shim, Authorized Officer, Dec. 23, 2009.

Besancon, Robert (ed)—Vacuum Techniques,3rd edition, 1990, pp. 1278-1284.

Gupta et al., "Ink Jet Printed Organic Displays," SID International Symposium Digest of Technical Papers, 2004, vol. 35, No. 2, pp. 1281-1283.

Lombrana et al., "The Influence of Pressure and Temperature on Freeze-Drying in an Adsorbent Medium and Establishment of Drying Strategies," Food Research International, 1997, vol. 30, No. 3-4, pp. 213-222.

Extended European Search Report for Application No. 10751285.7, counterpart to U.S. Appl. No. 13/203,279; Jun. 26, 2012.

Extended European Search Report for Application No. 10751290.7, counterpart to U.S. Appl. No. 13/202,416; Jun. 26, 2012.

Extended European Search Report for Application No. 10749428.8, counterpart to U.S. Appl. No. 13/203270; Jul. 11, 2012.

PCT International Search Report for Application No. PCT/US2010/026658, PCT counterpart to U.S. Appl. No. 13/203,279; Lee Byul Sup, Authorized Officer; Sep. 2, 2010.

PCT International Search Report for Application No. PCT/US2010/026467, PCT counterpart to U.S. Appl. No. 13/203,270; Lee, Byul Sup, Authorized Officer; Sep. 27, 2010.

PCT International Search Report for Application No. PCT/US2010/026669, PCT counterpart to U.S. 13/202,416; Choi, Sangwon, Authorized Officer; Oct. 15, 2010.

* cited by examiner

PROCESS FOR FORMING AN ELECTROACTIVE LAYER

BACKGROUND INFORMATION

1. Field of the Disclosure

This disclosure relates in general to a process for forming an electroactive layer. It further relates to electronic devices having at least one electroactive layer made by the process.

2. Description of the Related Art

An electronic device can include a liquid crystal display ("LCD"), an organic light-emitting diode (OLED) display, a thin film transistor (TFT) array, a solar cell, or the like. The manufacture of electronic devices may be performed using solution deposition techniques. One process of making electronic devices is to deposit organic layers over a substrate by printing (e.g., ink-jet printing, continuous printing, etc.). In a printing process, the liquid composition being printed includes an organic material in a solution, dispersion, emulsion, or suspension with an organic solvent, with an aqueous solvent, or with a combination of solvents. After printing, the solvent(s) is(are) evaporated and the organic material remains to form an organic layer for the electronic device.

There is a continuing need for deposition processes that result in devices having improved performance.

SUMMARY

There is provided a process for forming a layer of electroactive material. The process comprises:

providing a workpiece having at least one active area;

depositing a liquid composition comprising the electroactive material onto the workpiece in the active area, to form a wet layer;

treating the wet layer on the workpiece at a controlled temperature in the range of −25 to 80° C. and under a vacuum in the range of $10^{-6}$ to 1,000 Torr, for a first period of 1-100 minutes, to form a partially dried layer;

heating the partially dried layer to a temperature above 100° C. for a second period of 1-50 minutes to form a dried layer, wherein the dried layer has a substantially flat profile in the active area.

There is also provided an electronic device having at least one active area comprising an anode, a cathode, and at least one electroactive layer therebetween, wherein the electroactive layer is formed by liquid deposition and has a substantially flat profile in the active area.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
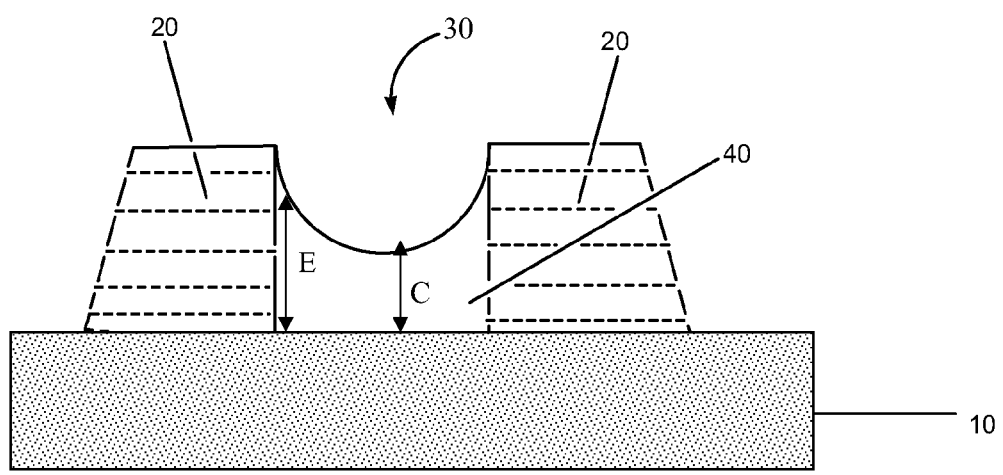
FIG. 1 includes an illustration of a dried electroactive film having a non-uniform film thickness.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Process, the Electronic Device, and finally Examples.

1. DEFINITIONS AND CLARIFICATION OF TERMS

Before addressing details of embodiments described below, some terms are defined or clarified.

The term "aperture ratio" is intended to mean a ratio of the area of a pixel available for emitting or responding to radiation to the total area of the pixel.

The term "charge transport," when referring to a layer, material, member, or structure is intended to mean such layer, material, member, or structure facilitates migration of such charge through the thickness of such layer, material, member, or structure with relative efficiency and small loss of charge. "Hole transport" refers to charge transport for positive charges. "Electron transport" refers to charge transport for negative charges. Although light-emitting materials may also have some charge transport properties, the term "charge transport layer, material, member, or structure" is not intended to include a layer, material, member, or structure whose primary function is light emission.

The term "electroactive" as it refers to a layer or a material, is intended to indicate a layer or material which electronically facilitates the operation of a device. Examples of active materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The term "electronic device" is intended to mean a collection of circuits, electronic components, or any combination thereof that collectively, when properly electrically connected and supplied with the appropriate potential(s), performs a function. An electronic device may be included or be part of a system. Examples of an electronic device include, but are not limited to, a display, a sensor array, a computer system, an avionics system, an automobile, a cellular phone, other consumer or industrial electronic products, or any combination thereof.

The term "guest material" is intended to mean a material, within a layer including a host material, that changes the electronic characteristic(s) or the targeted wavelength of radiation emission, reception, or filtering of the layer compared to the electronic characteristic(s) or the wavelength of radiation emission, reception, or filtering of the layer in the absence of such material.

The term "hole injection," when referring to a layer, material, member, or structure is intended to mean an electrically conductive or semiconductive material, layer, member or structure that is adjacent to an anode and facilitates electrode function.

The term "host material" is intended to mean a material, usually in the form of a layer, to which a guest material may or may not be added. The host material may or may not have electronic characteristic(s) or the ability to emit, receive, or filter radiation.

The term "layer" is used interchangeably with the term "film" and refers to a coating covering a desired area. The term is not limited by size. The area can be as large as an entire device or as small as a specific functional area such as the actual visual display, or as small as a single sub-pixel.

The term "liquid composition" is intended to mean a material that is dissolved in a liquid medium to form a solution, dispersed in a liquid medium to form a dispersion, or suspended in a liquid medium to form a suspension or an emulsion.

The term "liquid medium" is intended to a liquid within a solution, dispersion, suspension, or emulsion. The term "liquid medium" is used regardless whether one or more solvents are present, and therefore, liquid medium is used as the singular or plural form (i.e., liquid media) of the term.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels. A sensor array can include pixels that may or may not include subpixels.

The term "workpiece" is intended to mean a substrate at any particular point of a process sequence. Note that the substrate may not significantly change during a process sequence, whereas the workpiece significantly changes during the process sequence. For example, at a beginning of a process sequence, the substrate and workpiece are the same. After a layer is formed over the substrate, the substrate has not changed, but now the workpiece includes the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics, 81st Edition* (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. THE PROCESS

When layers are formed by liquid deposition processes, the dried films frequently do not have a uniform thickness across the film area. This can be caused by surface non uniformities in the substrate, edge effects, differences in evaporation rates across the wet film, etc. In some embodiments, electroactive materials are applied by liquid deposition processes onto workpieces having physical containment structures, frequently referred to as well structures. The dried film can have non-uniform thickness, such as shown in FIG. 1. Substrate 10, which may have additional layers, has a containment structure shown as 20 defining opening 30. The dried electroactive film is shown as 40. The thickness of the film is measured in a direction perpendicular to the plane of the substrate. It can be seen that the thickness at E is considerably greater than the thickness at C. Such thickness non-uniformity in an electroactive layer can have an adverse effect on device performance. In OLEDs, non-uniformity in light-emitting layers can cause undesirable effects such as color variation, lower efficiency, and lower lifetime.

There is described herein a process for forming an electroactive layer. The process comprises steps, in order, including:

providing a workpiece having at least one active area;

depositing a liquid composition comprising the electroactive material onto the workpiece in the active area, to form a wet layer;

treating the wet layer on the workpiece at a controlled temperature in the range of −25 to 80° C. and under a vacuum in the range of $10^{-6}$ to 1,000 Torr, for a first period of 1-100 minutes, to form a partially dried layer;

heating the partially dried layer to a temperature above 100° C. for a second period of 1-50 minutes to form a dried layer, wherein the dried layer has a substantially flat profile in the active area.

Figure 2:
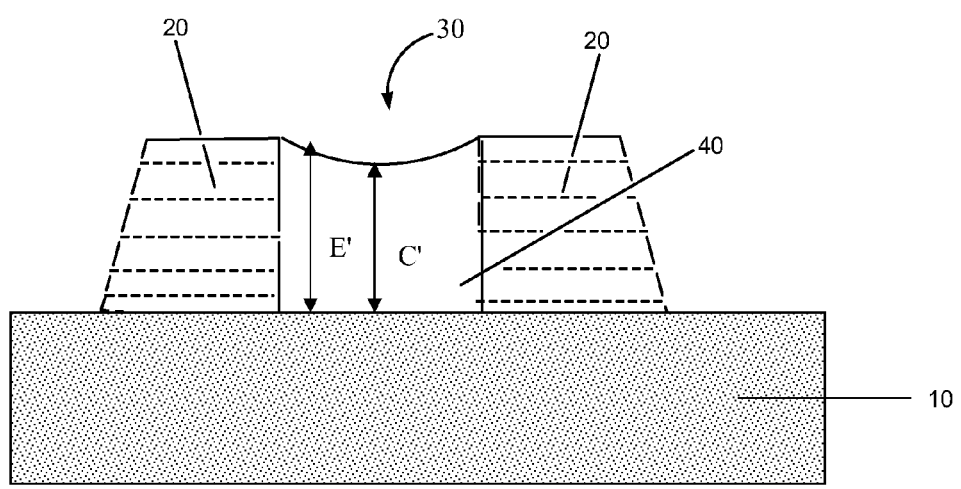
FIG. 2 includes an illustration of a dried electroactive film having a substantially flat profile.

The term "substantially flat" is intended to mean that the layer has a thickness variation of no greater than +/−15% over 90% of the layer area. In some embodiments, the thickness variation is no greater than +/−10% over 90% of the layer area. An electroactive layer having a substantially flat profile is shown in FIG. 2. As in FIG. 1, substrate 10 has a containment structure shown as 20 defining opening 30. The deposited electroactive film after drying is shown as 40. The film has a substantially flat profile with the thickness at E' being only slightly greater than the thickness at C'.

The workpiece includes a substrate and any desired intervening layers. In some embodiments, the workpiece is a TFT substrate having a patterned anode layer thereon. In some embodiments, the workpiece additionally has a liquid containment structure. In some embodiments, the workpiece additionally has a first electroactive layer, and a second electroactive layer is deposited on the first electroactive layer according to the process described herein.

The workpiece has at least one active area. The active area is the functioning area of the device. In some embodiments, the workpiece has a multiplicity of active areas. In some embodiments, the active areas correspond to pixel or subpixel units.

The electroactive material is deposited onto the workpiece from a liquid composition to form a wet layer. Any liquid medium can be used so long as the electroactive material can be dispersed therein to form a substantially homogeneous solution, dispersion, emulsion or suspension. Aqueous, semi-aqueous and non-aqueous liquid media can be used. The exact liquid media used will depend upon the electroactive material used.

In some embodiments, the electroactive material is a hole-injection material. In some embodiments, the electroactive material is a hole transport material. In some embodiments, the electroactive material is a combination of host material and photoactive guest material.

Any liquid deposition technique can be used, including continuous and discontinuous techniques. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing. In some embodiments, the deposition technique is selected from the group consisting of ink jet printing and continuous nozzle coating.

The liquid composition is deposited in at least a first portion of the active area(s) of the workpiece. In some embodiments, the electroactive material is a hole injection material or a hole transport material and is deposited in all of the active area(s) of the workpiece. In some embodiments, the liquid composition comprises a photoactive material associated with a first color, and is deposited in a first set of active areas. A second liquid composition comprising a second photoactive material associated with a second color, is then deposited in a second set of active areas. A third liquid composition comprising a third photoactive material associated with a third color, is then deposited in a third set of active areas.

The wet layer is then partially dried. By this it is meant that a substantial portion, but not all, of the liquid medium is removed. In some embodiments, greater than 75% by weight of the liquid medium is removed; in some embodiments, greater than 85% by weight is removed. This partial drying step takes place under conditions of controlled temperature, vacuum pressure, and time.

The exact conditions of temperature, pressure and time will depend on the composition of the liquid medium and liquid interaction with the substrate and well material. Appropriate temperature and pressure conditions are chosen to balance drying rate (via vapor pressure and rate of removal) with substrate/liquid interaction. The surface tension and viscosity of the liquid medium control wetting on the substrate and must be considered in choosing the appropriate temperature and pressure for drying.

In some embodiments, the liquid medium comprises at least two liquid components, and at least one component has a boiling point of greater than 100° C. In some embodiments, the partial drying step takes place at a temperature in the range of 20-80° C., at a pressure in the range of $10^{-2}$ to 10 Torr, for a time of 5-25 minutes. In some embodiments, the partial drying step takes place at a temperature in the range of 30-60° C., at a pressure in the range of $10^{-2}$ to 1 Torr, for a time of 5-15 minutes.

In some embodiments, the liquid medium comprises one or more liquid components, each of which has a boiling point of less than 80° C. In some embodiments, the partial drying step takes place at a temperature in the range of −25 to 10° C., at a pressure in the range of 1 to 1000 Torr, for a time of 5-25 minutes. In some embodiments, the partial drying step takes place at a temperature in the range of −10 to 0° C., at a pressure in the range of 10 to 100 Torr, for a time of 5-15 minutes.

The workpiece is then heated to a temperature above 100° C. for a second period of 1-50 minutes. In some embodiments, the temperature is in the range of 110-150° and the heating time is in the range of 10-30 minutes.

In some embodiments, the liquid composition comprises a photoactive material, and three different compositions associated with first, second, and third colors are deposited in first, second and third sets of active areas. In this case, the partial drying and heating steps can be carried out after the deposition of each color. Alternatively, the three different colors can be deposited, and then the partial drying and heating steps carried out.

3. ELECTRONIC DEVICE

There is provided an electronic device having at least one active area comprising an anode, a cathode, and at least one electroactive layer therebetween, wherein the electroactive layer is formed by liquid deposition and has a substantially flat profile in the active area.

Devices for which the process described herein can be used include organic electronic devices. The term "organic electronic device" or sometimes just "electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

Figure 3:
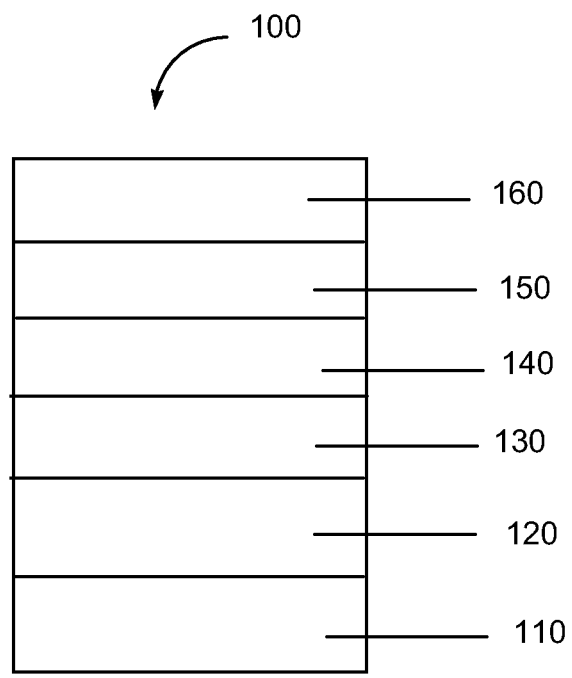
FIG. 3 includes an illustration of an exemplary electronic device.

As shown in FIG. 3, one embodiment of a device, 100, has an anode layer 110, a photoactive layer 140, and a cathode layer 160. The term "photoactive" is intended to mean to any material that exhibits electroluminescence or photosensitivity. Also shown are three optional layers: hole injection layer 120; hole transport layer 130; and electron injection/transport layer 150. At least one of the anode and cathode is light-transmitting so that light can pass through the electrode.

The device may include a support or substrate (not shown) that can be adjacent to the anode layer 110 or the cathode layer 160. Most frequently, the support is adjacent the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 160. Thus, the anode has a higher work-function than the cathode. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide ("IZO"), aluminum-tin-oxide ("ATO"), gold, silver, copper, and nickel.

In some embodiments, there is a liquid containment pattern, not shown, over the anode. The term "liquid containment pattern" is intended to mean a pattern which serves a principal function of constraining or guiding a liquid within an area or region as it flows over the workpiece. The liquid containment pattern can be a physical containment structure or a chemical containment layer. Physical containments structures can include cathode separators or a well structure. The term "chemical containment layer" is intended to mean a patterned layer that contains or restrains the spread of a liquid material by surface energy effects rather than physical barrier structures. The term "contained" when referring to a layer, is intended to mean that the layer does not spread significantly beyond the area where it is deposited. The term "surface energy" is the energy required to create a unit area of a surface from a material. A characteristic of surface energy is that liquid materials with a given surface energy will not wet surfaces with a lower surface energy.

The hole injection layer 120 can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can comprise charge transfer compounds, and the like, such as copper phthalocyanine and the tetrathiafulvalene-tetracyanoquinodimethane system (TTF-TCNQ). In one embodiment, the hole injection layer 120 is made from a dispersion of a conducting polymer and a colloid-forming polymeric acid. Such materials have been described in, for example, published U.S. patent applications 2004-0102577, 2004-0127637, and 2005-0205860.

In some embodiments, optional hole transport layer 130 is present. between anode layer 110 and photoactive layer 140. In some embodiments, optional hole transport layer is present between a buffer layer 120 and photoactive layer 140. Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis(9H-carbazol-9-yl) cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

Depending upon the application of the device, the photoactive layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the photoactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 150 can function both to facilitate electron injection/transport, and can also serve as a confinement layer to prevent quenching reactions at layer interfaces. More specifically, layer 150 may promote electron mobility and reduce the likelihood of a quenching reaction if layers 140 and 160 would otherwise be in direct contact. Examples of materials for optional layer 150 include, but are not limited to, metal chelated oxinoid compounds, including metal quinolate derivatives such as tris(8-hydroxyquinolato)aluminum (AIQ), bis(2-methyl-8-quinolinolato)(p-phenylphenolato)aluminum (BAlq), tetrakis-(8-hydroxyquinolato)hafnium (HfQ) and tetrakis-(8-hydroxyquinolato)zirconium (ZrQ); tetrakis(8-hydroxyquinolinato)zirconium (ZrQ); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. Alternatively, optional layer 150 may be inorganic and comprise BaO, LiF, $Li_2O$, CsF, or the like. In some embodiments, two electron transport/injection layers are present. A first organic electron transport layer is present adjacent to the photoactive layer, and a second inorganic electron injection layer is present adjacent to the cathode.

The cathode layer 160 is an electrode that is particularly efficient for injecting electrons or negative charge carriers. The cathode layer 160 can be any metal or nonmetal having a lower work function than the anode layer 110.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 160 include, but are not limited to, barium, lithium, cerium, cesium, europium, rubidium, yttrium, magnesium, samarium, and alloys and combinations thereof.

Other layers in the device can be made of any materials which are known to be useful in such layers upon consideration of the function to be served by such layers.

In some embodiments, an encapsulation layer (not shown) is deposited over the contact layer 160 to prevent entry of undesirable components, such as water and oxygen, into the device 100. Such components can have a deleterious effect on the organic layer 140. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110, the buffer layer 120, the hole transport layer 130, the electron transport layer 150, cathode layer 160, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In most cases, the anode 110 and the cathode 160 are formed by a chemical or physical vapor deposition process. In some embodiments, the anode layer will be patterned and the cathode will be an overall continuous layer.

In some embodiments, the electron transport/injection layer or layers are also formed by a chemical or physical vapor deposition process.

In some embodiments, at least the photoactive layer is formed by liquid deposition according to the process described herein.

In some embodiments, hole injection and hole transport layers are formed by liquid deposition according to the process described herein.

In one embodiment, the different layers have the following range of thicknesses: anode 110, 500-5000 Å, in one embodiment 1000-2000 Å; optional buffer layer 120, 50-2000 Å, in one embodiment 200-1000 Å; optional hole transport layer 130, 50-2000 Å, in one embodiment 100-1000 Å; photoactive layer 140, 10-2000 Å, in one embodiment 100-1000 Å; optional electron transport layer 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the photoactive layer, releasing photons. In some OLEDs, called active matrix OLED displays, individual pixels may be independently excited by the passage of current. In some OLEDs, called passive matrix OLED displays, individual pixies may be excited at the intersections of rows and columns of electrical contact layers.

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

EXAMPLES

The concepts described herein will be further described in the following examples, which do not limit the scope of the invention described in the claims.

Example 1

This example demonstrates the fabrication of an electroactive film for OLED application having a substantially flat profile. The following materials were used:

Indium Tin Oxide (ITO): 180 nm buffer layer=Buffer 1 (20 nm), which is an aqueous dispersion of an electrically conductive polymer and a polymeric fluorinated sulfonic acid. Such materials have been described in, for example, published U.S. patent applications US 2004/0102577, US 2004/0127637, and US 2005/0205860.

hole transport layer=HT-1, which is an arylamine-containing copolymer. Such materials have been described in, for example, published U.S. patent application US 2008/0071049.

photoactive layer=13:1 host H1:dopant E1. Host H1 is an anthracene derivative. Such materials have been described in, for example, U.S. Pat. No. 7,023,013. E1 is an arylamine compound. Such materials have been described in, for example, U.S. published patent application US 2006/0033421.

electron transport layer=a metal quinolate derivative cathode=LiF/Al (0.5/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 50 ohms/square and 80% light transmission. A well pattern was fabricated on the ITO substrate using standard photolithographic processes. The well was defined by a width of 32 microns.

Immediately before device fabrication the cleaned, patterned substrates were treated with UV ozone for 10 minutes. Immediately after cooling, an aqueous dispersion of Buffer 1 was spin-coated over the ITO surface and heated to remove solvent. After cooling, the substrates were then spin-coated with a solution of the hole transport material, and then heated to remove solvent. A chemical containment layer was formed as described in published U.S. patent application US 2007/0205409. The pattern defined a surface energy well to contain nozzle printed photoactive inks. The surface energy well was 40 microns wide.

An emissive layer solution was formed by dissolving the host and dopant, described above, in an organic solvent medium, as described in published PCT application WO 2007/145979.

The substrates were nozzle printed with the emissive layer solution, and vacuum dried to remove solvent. Immediately after printing, the plate was placed in a vacuum chamber held at 20° C. and pumped to 500 mTorr for 14 minutes before venting with nitrogen. The plate was then baked for 30 minutes at 140° C. on a hotplate.

Figure 4:
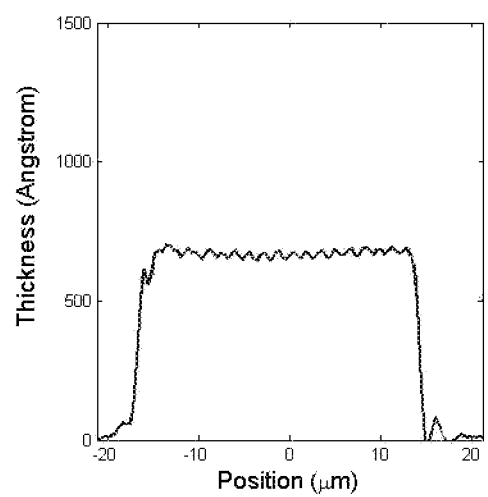
FIG. 4 includes a graph of layer thickness from Example 1.

Film thickness and profile measurements were made using a KLA-Tencor P-15 stylus profilometer with low force head. Printed photoactive layer thickness and profile were determined by subtracting a non-printed line from a printed line in close proximity. This technique allows profile differences in under-layers to be de-coupled from the emissive layer. FIG. 4 shows the profile of the printed photoactive layer with aperture ratio=0.91.

Comparative Example A

OLED devices were fabricated using the same materials as in Example 1. The devices were fabricated using the same procedures as in Example 1, except for the drying step after printing. Immediately after the substrates were nozzle printed with the emissive layer solution, the plate was placed on a hotplate at 140° C. for 30 min.

Figure 5:
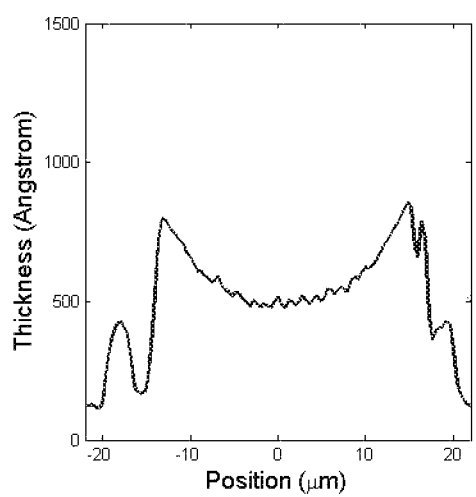
FIG. 5 includes a graph of layer thickness from Comparative Example A.

Film thickness and profile measurements were made as in Example 1. FIG. 5 shows the profile of the printed photoactive layer, with aperture ratio=0.42.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A process for forming a layer of electroactive material, comprising:
    providing a workpiece having at least one active area;
    depositing a liquid composition comprising the electroactive material in a liquid medium onto the workpiece in the active area, to form a wet layer, wherein the liquid medium comprises at least two liquid components, and at least one component has a boiling point of greater than 100° C.;
    treating the wet layer on the workpiece at a controlled temperature in the range of 30-60° C., at a pressure in the range of $10^{-2}$ to 1 Torr, for a first period of 5-15 minutes, to form a partially dried layer;
    heating the partially dried layer to a temperature above 100° C. for a second period of 1-50 minutes to form a dried layer,
    wherein the dried layer has a substantially flat profile in the active area.

2. The process of claim 1, wherein the dried layer has a thickness variation of less than +1-10% over 90% of the active area.

3. The process of claim 1, wherein the liquid composition is deposited by a technique selected from the group consisting of ink jet printing and continuous nozzle coating.

4. The process of claim 1, wherein the workpiece has a multiplicity of active areas.

5. The process of claim 4, wherein the electroactive material comprises a host material and a photoactive guest material corresponding to a first color, and the liquid composition is deposited in a first portion of the active areas.

6. The process of claim 5, wherein a second liquid composition comprising a second host material and a second photoactive guest material corresponding to a second color is deposited in a second portion of the active areas.

7. The process of claim 6, wherein a third liquid composition comprising a third host material and a third photoactive guest material corresponding to a third color is deposited in a third portion of the active areas.

8. The process of claim 1, wherein the electroactive material consists essentially of a hole injection material.

9. The process of claim 1, wherein the electroactive material consists essentially of a hole transport material.

10. A process for forming a layer of electroactive material, comprising:
    providing a workpiece having at least one active area;
    depositing a liquid composition comprising the electroactive material in a liquid medium onto the workpiece in the active area, to form a wet layer, wherein the liquid medium comprises one or more liquid components, each of which has a boiling point of less than 80° C.;
    treating the wet layer on the workpiece at a controlled temperature in the range of −25 to 10° C. and under a vacuum in the range of 1 to 1,000 Torr, for a first period of 5-25 minutes, to form a partially dried layer;

heating the partially dried layer to a temperature above 100° C. for a second period of 1-50 minutes to form a dried layer, wherein the dried layer has a substantially flat profile in the active area.

11. The process of claim 10, wherein the wet layer on the workpiece is treated at a temperature in the range of −10 to 0° C., at a pressure in the range of 10 to 100 Torr, for a time of 5-15 minutes.

12. The process of claim 10, wherein the wet layer on the workpiece is treated at a temperature in the range of −25 to 10° C., at a pressure in the range of 1 to 1000 Torr, for a time of 5-25 minutes.

13. The process of claim 10, wherein the dried layer has a thickness variation of less than +/−10% over 90% of the active area.

14. The process of claim 10, wherein the liquid composition is deposited by a technique selected from the group consisting of ink jet printing and continuous nozzle coating.

15. The process of claim 10, wherein the workpiece has a multiplicity of active areas.

16. The process of claim 15, wherein the electroactive material comprises a host material and a photoactive guest material corresponding to a first color, and the liquid composition is deposited in a first portion of the active areas.

17. The process of claim 16, wherein a second liquid composition comprising a second host material and a second photoactive guest material corresponding to a second color is deposited in a second portion of the active areas.

18. The process of claim 17, wherein a third liquid composition comprising a third host material and a third photoactive guest material corresponding to a third color is deposited in a third portion of the active areas.

19. The process of claim 10, wherein the electroactive material consists essentially of a hole injection material.

20. The process of claim 10, wherein the electroactive material consists essentially of a hole transport material.

* * * * *